(12) United States Patent
Akiyama et al.

(10) Patent No.: US 7,677,121 B2
(45) Date of Patent: Mar. 16, 2010

(54) APPARATUS AND METHODS FOR MEASURING SHAPE OF BOTH SIDES OF A PLATE

(75) Inventors: Shigetaka Akiyama, Shizuoka (JP); Shinichi Tanaka, Shizuoka (JP); Takanobu Akiyama, Shizuoka (JP); Katsunobu Ueda, Kanagawa (JP); Yasuyuki Kita, Nagasaki (JP)

(73) Assignee: Toshiba Kikai Kabushiki Kaisha, Tokyo (JP)

( * ) Notice: Subject to any disclaimer, the term of this patent is extended or adjusted under 35 U.S.C. 154(b) by 318 days.

(21) Appl. No.: 11/462,737

(22) Filed: Aug. 7, 2006

(65) Prior Publication Data
US 2007/0184356 A1 Aug. 9, 2007

(30) Foreign Application Priority Data
Aug. 8, 2005 (JP) .............................. 2005-229505

(51) Int. Cl.
G01M 19/00 (2006.01)
B23Q 17/09 (2006.01)
(52) U.S. Cl. ....................................... 73/865.8; 73/104
(58) Field of Classification Search ................ 73/865.8, 73/104; 33/546, 551, 552, 555
See application file for complete search history.

(56) References Cited

U.S. PATENT DOCUMENTS 5,617,643 A * 4/1997 Kato et al. .................... 33/533

FOREIGN PATENT DOCUMENTS

| JP | 03-090805 | 4/1991 |
| JP | 04355315 A * | 12/1992 |
| JP | 11-351857 | 12/1999 |
| JP | 2000-055641 | 2/2000 |
| JP | 2000055641 A * | 2/2000 |
| JP | 2000-292152 | 10/2000 |
| JP | 2003-022834 | 1/2003 |

OTHER PUBLICATIONS

Office Action issued in Chinese Application No. 2006101107124, date-stamped Dec. 14, 2007.
Partial English translation of Office Action issued in Chinese Application No. 2006101107124, date-stamped Dec. 14, 2007.

(Continued)

*Primary Examiner*—Hezron Williams
*Assistant Examiner*—Tamiko D Bellamy
(74) *Attorney, Agent, or Firm*—DLA Piper LLP (US)

(57) ABSTRACT

In an apparatus for measuring shapes of both sides of a plate, a measuring apparatus body includes a reference plane of a longitudinal surface plate disposed in an almost vertical state at one end on a metallic bed, a holding mechanism for holding a plate to be measured in almost parallel therewith, and a displacement gauge scanning column. The displacement gauge scanning column includes a first air slide for mounting a first (second) displacement gauge and a second air slide for mounting a third displacement gauge, and is moved in a horizontal axis direction along a pair of V grooves. Moreover, the first (second) air slide is moved in a vertical axis direction. A shape of one of plate surfaces of the plate to be measured is measured by the scan of the first (second) displacement gauge, and at the same time, a shape of the other surface of the plate surface is measured by the scan of the third displacement gauge.

18 Claims, 8 Drawing Sheets

OTHER PUBLICATIONS

Korean Office Action issued in counterpart foreign Korean Application No. 10-2006-0073998, mailed Feb. 22, 2008.
English translation of Korean Office Action issued in counterpart foreign Korean Application No. 10-2006-0073998, mailed Feb. 22, 2008.
English language translation of Office Action issued by the Korean Patent Office on Jul. 18, 2007.
Korean Office Action issued by Korean Patent Office on Jul. 18, 2007.
English Abstract of Japanese Patent Application No. 2001-208117 filed Jul. 9, 2001, published on Jan. 24, 2003, under Publication No. 2003-022834.
Korean Office Action issued in Application No. 10-2006-0073998 mailed Feb. 9, 2009.
English Language Translation of Korean Office Action issued in Application No. 10-2006-0073998 mailed Feb. 9, 2009.
Korean Office Action mailed May 26, 2009 which issued in corresponding Korean Application 10-2006-0073998.
English Language Translation of Korean Office Action mailed May 26, 2009 which issued in corresponding Korean Application 10-2006-0073998.
English Language Abstract of Japanese Publication No. 11-351857 published Dec. 24, 1999.
Machine English Translation of Japanese Publication No. 11-351857 published Dec. 24, 1999.
English Language Abstract of Japanese Publication No. 2000-292152 published Oct. 20, 2000.
Machine English Translaton of Japanese Publication No. 2000-292152 published Oct. 20, 2000.
English Language Abstract of Japanese Publication No. 2000-055641 published Feb. 25, 2000.
Machine English Translation of Japanese Publication No. 2000-055641 published Feb. 25, 2000.
English Language Abstract of Japanese Publication No. 03-090805 published Apr. 15, 1991.
Machine English Translation of Japanese Publication No. 2003-022834 published Jan. 24, 2003.
English Language Abstract of Japanese Publication No. 04-355315 published Dec. 1, 1992.
English Translation of Korean Office Action issued in KR 10-2006-0073998 on Aug. 17, 2009.
Korean Office Action issued in KR 10-2006-0073998 on Aug. 17, 2009.

* cited by examiner

APPARATUS AND METHODS FOR MEASURING SHAPE OF BOTH SIDES OF A PLATE

CROSS-REFERENCE TO RELATED APPLICATION

This application is based on and claims priority of Japanese Patent Application (JPA) No. 2005-229505 filed on Aug. 8, 2005, the entire contents of which are incorporated herein by reference.

BACKGROUND OF THE INVENTION

1. Field of the Invention

The present invention relates to an apparatus and methods for measuring the shape of both sides of a plate, and more particularly, for measuring a surface and a back surface of a plate when the shape of each of the surfaces of the plate is important such as for photomasks made of quartz glass for use in manufacturing of high-precision, large-sized liquid crystal displays.

2. Related Art

For example, in the manufacturing of a TFT (thin film transistor) array of a liquid crystal display plate, a mask pattern formed by a shielding film on a surface of a photomask is exposed and projected by a photolithographic technique such that the pattern is transferred onto a mother glass. Then, the TFT array is formed on the mother glass by the photolithographic technique and a so-called process technique. Similarly, a color filter of a liquid crystal display plate is else manufactured by a lithographic method referred to as a dye impregnating method. The manufacturing of both the TFT array side and the color filter side typically requires the use of a large-sized photomask. In order to transfer the mask pattern with high precision, the large-sized photomask is generally made of a synthetic quartz glass having a small coefficient of linear expansion.

The demand for larger-sized mother glass used for manufacturing the liquid crystal display plates has been increasing. Currently, large-sized photomasks having dimensions of 1500 mm×1500 mm are being used. The plate thickness for such large-sized photomasks is 10 mm to 20 mm.

In these large-sized photomasks, the degree of flatness over the surface of the photomask on which the mask pattern is formed is important. For each photomask, the degree of flatness of a surface is measured, and a strict quality management is used for selecting photomasks within a standard range. Therefore, various apparatuses for measuring the degree of flatness of the surface of large-sized photomasks have been proposed so far (for example, Japanese Patent Application, Publication No. H03-90805 and 2000-55641). Some of these apparatuses have already been used practically for managing the degree of flatness of large-size plates such as large-sized photomask plates.

For liquid crystal display plates, resolution has also been increasing from, for example, VGA to SVGA, XGA, SXGA, UXGA and QXGA. Furthermore, a method has been used for making TFTs that uses low-temperature polysilicon and forming an IC for a driver in an outer peripheral portion of the mother glass separately from a pixel of the display. As a result, demand has increased for improvements in precision in pattern transfer on the TFT array side, particularly in the precision of the exposure and projection alignment of the pattern.

To improve the pattern transfer precision in photolithography has required the use of strict quality management controls on the degree of flatness over the entire surface of the photomask and the degree of flatness of of a back surface of the photomask which is opposed thereto. This will be described with reference to FIG. 8. In this configuration, FIG. 8A shows the case in which a surface 102 of a photomask 101 takes a convex shape and a back surface 103 takes a relatively flat surface. FIG. 8B shows the case in which the surface 102 of the photomask 101 takes a relatively flat shape and the back surface 103 takes a concave shape.

As shown in FIG. 5A, when the surface of the photomask 101 takes the convex shape, an exposed light 104 shown in a solid line which is incident from the back surface 103 side of the photomask 101 causes winding due to the convex shape of the surface 102, thereby exposing a photosensitive film (not shown) provided on a surface of a mother glass 105. Due to the winding of the exposed light 104, a shift is generated on a transfer position in the pattern transfer. A dotted line in the drawing shows an ideal optical path in which the surface 102 does not have a convex shape and through which the light advances in a straight direction. By increasing the degree of flatness of the surface of the photomask to approximate that of a surface that would produce an ideal optical path, the precision in the pattern transfer on the TFT array side would be enhanced.

Also in FIG. 5B, the same situation as that in FIG. 8A is generated though the extent of the effect on the incident light is smaller. As shown in FIG. 5B, when the exposed light 104 is incident from the back surface 103 side having a concave shape, the optical path reaches the surface 102 with winding thereon. The degree of the winding is reduced by the surface 102. Accordingly, the photosensitive film (not shown) provided on the surface of the mother glass 105 is exposed. In this case, a shift in transfer position is also produced during the pattern transfer, even if it is smaller than that of FIG. 8A.

If improvements in the resolution of the liquid crystal display or in the precision of the pattern transfer to embed an IC for a driver are desirable, the positional shift of the pattern transfer caused by the concavo-convex shape of the back surface of the photomask is a drawback. For this reason, there exists a need to increase the degree of flatness of the back surface of the photomask to approximate that of a surface that would produce an ideal optical path and to use strict quality management to control the degree of flatness.

However, there has not been developed an apparatus for measuring shapes of both sides which can measure the shapes of a surface and a back surface of the photomask for a large-sized liquid crystal with high precision at the same time or a method of easily measuring the shapes of both sides or the degree of flatness of both sides with high precision.

BRIEF SUMMARY OF THE INVENTION

In consideration of the above-described circumstances, it is an object of the present invention to provide an apparatus and methods for measuring shapes of both sides of a plate, that is, a surface and a back surface with high precision. And the apparatus and the methods are for those plates in which the shapes of both sides of the plate are important elements in addition to the photomask for a liquid crystal.

An apparatus for measuring shapes of both sides of a plate according to an embodiment of the present invention comprises:

a surface plate disposed in such a manner that a reference plane of the surface plate is set in an almost vertical state;

a holding mechanism which holds a plate to be measured in such a manner that a plate surface of the plate to be measured is set in almost parallel with the reference plane;

a first displacement gauge and a second displacement gauge which are disposed between the reference plane of the surface plate and one surface of the plate to be measured which is held by the holding mechanism, the first and second displacement gauges being scanned in a vertical plane and serving to measure a distance from the reference plane of the surface plate and a distance from one surface of the plate to be measured together with the scan, respectively;

a third displacement gauge which is disposed on one side of the plate surfaces that is opposed to the other surface, the third displacement gauge being scanned in a vertical plane and serving to measure a distance from the other surface of the plate surface together with the scan; and computation means for calculating a shape of a surface of the plate to be measured based on a measurement result by each of the displacement gauges.

In the above embodiment of the invention, the first displacement gauge and the second displacement gauge are mounted on a first Y-axis moving mechanism which can be moved in a vertical axis direction in the reference plane, the third displacement gauge is mounted on a second Y-axis moving mechanism which can be moved in the vertical axis direction in the reference plane independently of the first Y-axis moving mechanism, and the first Y-axis moving mechanism and the second Y-axis moving mechanism are mounted on an X-axis moving mechanism which can be moved in a horizontal axis direction in the reference plane.

With the above-described configuration, it is possible to obtain a very high linearity and very high positioning precision in the movement of the X-axis moving mechanism and the two Y-axis moving mechanism. Accordingly, the first displacement gauge, the second displacement gauge and the third displacement gauge can be accurately scanned with high precision with respect to the reference plane of a surface plate. By setting the reference plane as a reference surface, it is possible to measure the shapes of one of surfaces and the other surface of the plate to be measured at the same time with high precision.

In an embodiment of the present invention, the first Y-axis moving mechanism and the second Y-axis moving mechanism comprise a ball screw and a slide coupled thereto, and the X-axis moving mechanism comprises a V-V rolling guide or a V-V slip guide. By employing an air slide as the slide, it is possible to prevent deterioration in precision from being caused by a vibration in positioning by means of the ball screw.

In an embodiment of the present invention, moreover, the first displacement gauge, the second displacement gauge and the third displacement gauge comprise non-contact laser displacement gauges.

In a method of measuring shapes of both sides of a plate according to another embodiment of the present invention, a reference plane of a surface plate is disposed in an almost vertical state, a plate to be measured is supported in such a manner that a plate surface of the plate to be measured is set in almost parallel with the reference plane, and a first displacement gauge disposed opposite to the reference plane and a second displacement gauge disposed opposite to one side of the plate surfaces of the plate to be measured are scanned in a vertical plane between the reference plane and one side of the plate surfaces of the plate to be measured, a distance between the surface of the plate surface and the reference plane is measured, and at the same time, a third displacement gauge disposed opposite to one surface side which is opposed to the other surface of the plate surface is scanned, and a distance between the other side of the plate surfaces and the reference plane is measured and surface shapes of one of the surfaces of the plate to be measured and the other surface are measured.

In the method of measuring shapes of both sides of a plate according to the above embodiment the invention, a reference block having a predetermined plate thickness is previously disposed between the second displacement gauge and the third displacement gauge, a distance $(A_1+A_2+L_0)$ between one surface of the reference block and the reference plane of the surface plate is measured by the first displacement gauge and the second displacement gauge, a distance $(A_3)$ from the other surface of the reference block is measured by the third displacement gauge and a distance $(A_0)$ between the third displacement gauge and the reference plane of the surface plate is measured.

With the configuration described above, it is possible to easily measure the shapes of both sides of a large-sized plate to as the photomask for a large-sized liquid crystal in a short time with high precision. Moreover, it is possible to obtain the degree of flatness of both sides, that is, one of surfaces and the other surface of the plate with high precision.

In an embodiment of the present invention, the first displacement gauge, the second displacement gauge and the third displacement gauge are scanned synchronously.

According to an embodiment of the present invention for the method of measuring shapes of both sides of a plate, moreover, it is possible to easily measure the shape of the plate by measuring a distance between one plane of the plate and the reference plane by means of the first displacement gauge and the second displacement gauge and measuring a distance between the other plane of the plate and the reference plane by means of the third displacement gauge.

According to an embodiment of the present invention, it is possible to measure the shapes of both sides, that is, the surface and the back surface with high precision in the plate in which the shapes of both sides of the plate are important elements. It is possible to measure the degree of flatness of both sides of the plate easily in a short time.

DETAILED DESCRIPTION OF THE INVENTION

Figure 1:
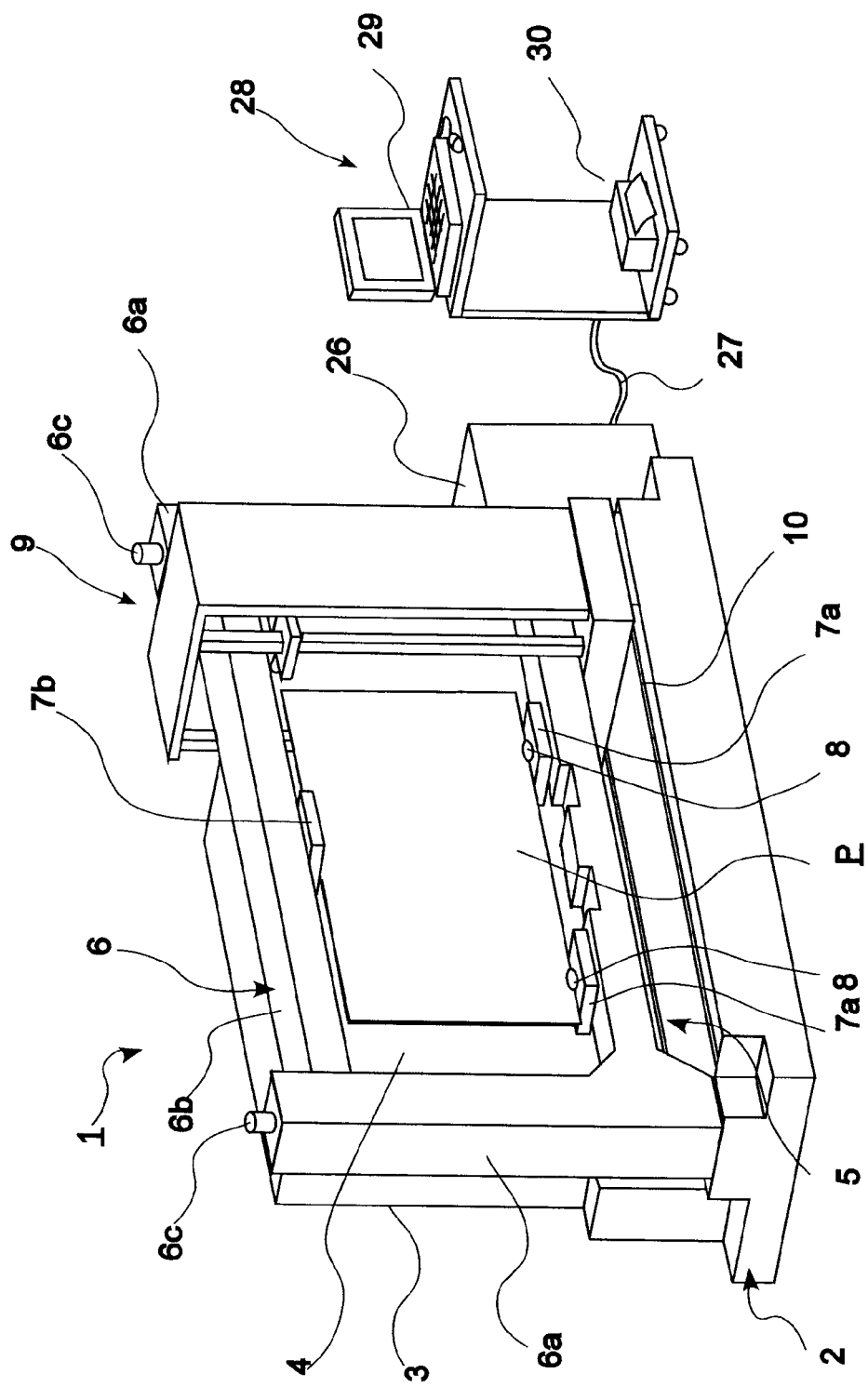
FIG. 1 is a view showing an entire configuration of an apparatus for measuring shapes of both sides of a plate according to the present invention.
Figure 2:
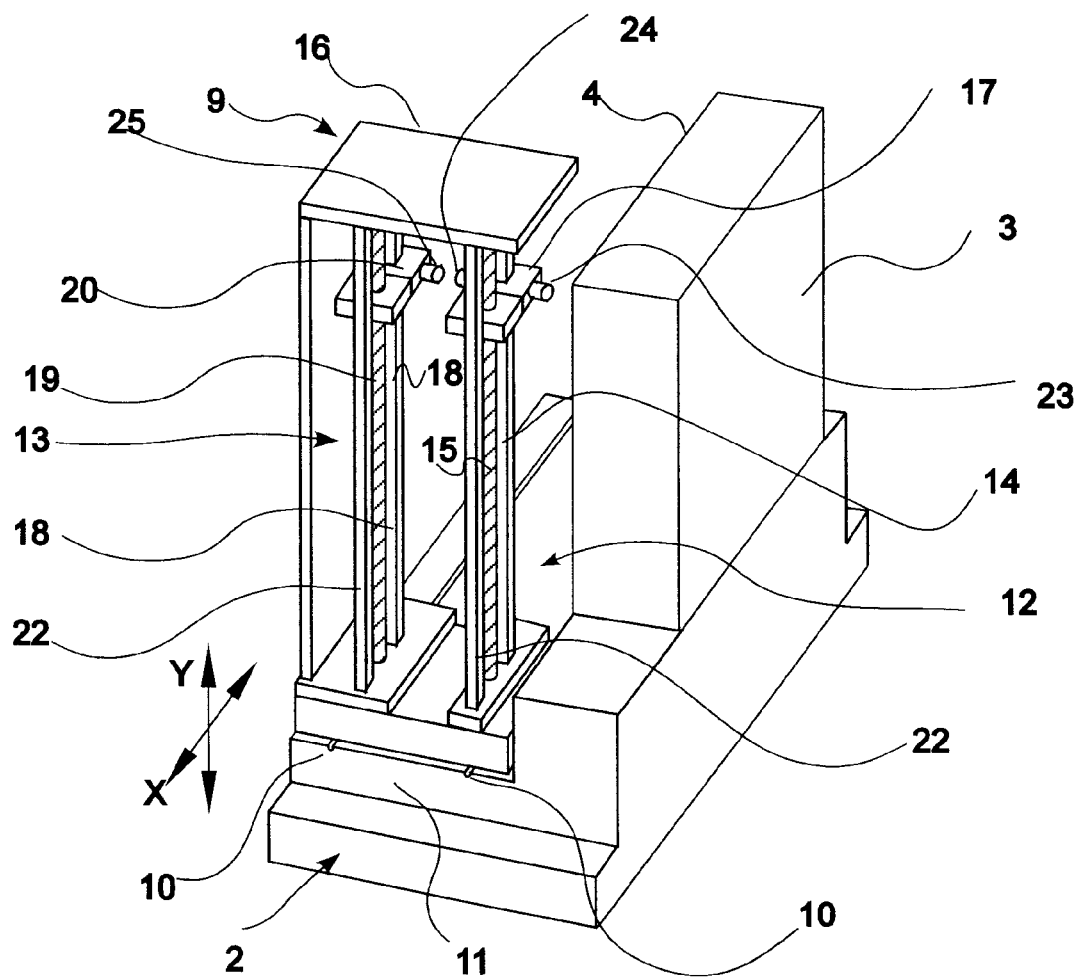
FIG. 2 is a perspective view showing a displacement gauge scanning unit of the apparatus for measuring shapes of both sides of the plate illustrated in FIG. 1.

An embodiment of the present invention will be described with reference to FIG. 1 to 7. FIG. 1 is a view showing an entire configuration of an apparatus for measuring the shapes of both sides of a plate. FIG. 2 is a perspective view showing a scan unit of a displacement gauge for measuring the shapes of both sides of the plate to be measured.

As shown in FIG. 1, in a measuring apparatus body 1, a longitudinal surface plate 3 is disposed at one end on a metallic bed 2. It is suitable that the longitudinal surface plate 3 should be configured by casting. A vertical plane of the longitudinal surface plate 3 is subjected to be rubbed or lapped. Accordingly, a surface thereof is coated with nickel and a reference plane 4 is formed. Thus, the reference plane 4 takes a planar shape having a surface roughness which almost approximates to zero, that is, 400 nm or less with high precision. For the longitudinal surface plate 3, it is possible to further use a material which can be subjected to flattening with high precision, for example, a metal, ceramics or granite referred to as a stone surface plate.

In front of the longitudinal surface plate 3 on the bed 2, there is a holding mechanism 5 for holding a plate P to be measured, for example, a photomask made of a quartz glass for a large-sized liquid crystal which has a width and length of approximately 1500 mm×1500 mm or less and a plate thickness of approximately 15 mm. The holding mechanism 5 has a holding member 6 made of a metal or ceramics. A cross beam 6b driven by means of a motor 6c and laid to be vertically movable is respectively provided between a pair of side columns 6a of the holding member 6. And a support and regulation can be carried out corresponding to a size of the plate P by the vertical movement of the cross beam 6b.

Moreover, there are provided a pair of lower support members 7a disposed apart from each other in a longitudinal direction in a lower part of the holding member 6. And there is provided an upper support member 7b disposed in almost a central part in a longitudinal direction of the cross beam 6b in an upper part of the holding member 6.

These support members 7a and 7b are provided with a gripping mechanism 8 for fixing the plate P. The gripping mechanism 8 is driven by means of a servomotor and can be moved in a vertical direction to the reference plane 4 of the longitudinal surface plate 3. By driving the servomotor, the surface of the plate P be disposed vertically with high precision.

A distance between the lower support members 7a can be regulated automatically or manually.

On the bed 2, there is disposed a displacement gauge scanning column 9 (an X-axis moving mechanism). The displacement gauge scanning column 9 has such a moving structure in an X-axis direction (a horizontal axis direction) in the reference plane 4 of the longitudinal surface plate 3. The displacement gauge scanning column 9 can be moved with high precision in the X-axis direction shown in FIG. 2 by means of a V-V rolling guide which carries out a linear movement along a pair of V grooves 10 provided on an upper surface of the bed 2.

The V-V rolling guide has a high degree of straightness which is equal to or lower than 2 µm in a stroke of 2300 mm in the horizontal axis direction over the upper surface of the bed 2. Moreover, positioning accuracy is high, that is, 0.1 µm or less.

As shown in FIG. 2, in the displacement gauge scanning column 9, a first air slide 12 (a first Y-axis moving mechanism) and a second air slide 13 (a second Y-axis moving mechanism) are provided in a vertical state on a metallic table 11 having a large weight, for example. The first air slide 12 has a guide rail 14 and a ball screw 15 which are attached onto a table 11 almost vertically, and is held by a fixed board 16 in an upper part thereof. A first slider 17 of the first air slide 12 is moved with high precision in a Y-axis direction (a vertical axis direction) in the reference plane 4. The first slider 17 moves along the guide rail 14 by means of the build-in motor-driven ball screw 15 which is provided in the table 11.

Similarly, the second air slide 13 has another guide rail 18 and another ball screw 19 which are attached onto the table 11 vertically, and is held by the fixed board 16 in an upper part thereof. A second slider 20 of the second air slide 13 is moved with high precision in the Y-axis direction in the reference plane 4. The second slider 20 moves along the guide rail 18 by means of the build-in motor-driven ball screw 19 which is provided in the table 11. It is suitable that materials of the guide rails 14 and 18, the first slider 17 and the second slider 20 should be, for example, aluminum or ceramics which are light weight and highly rigid.

Figure 3:
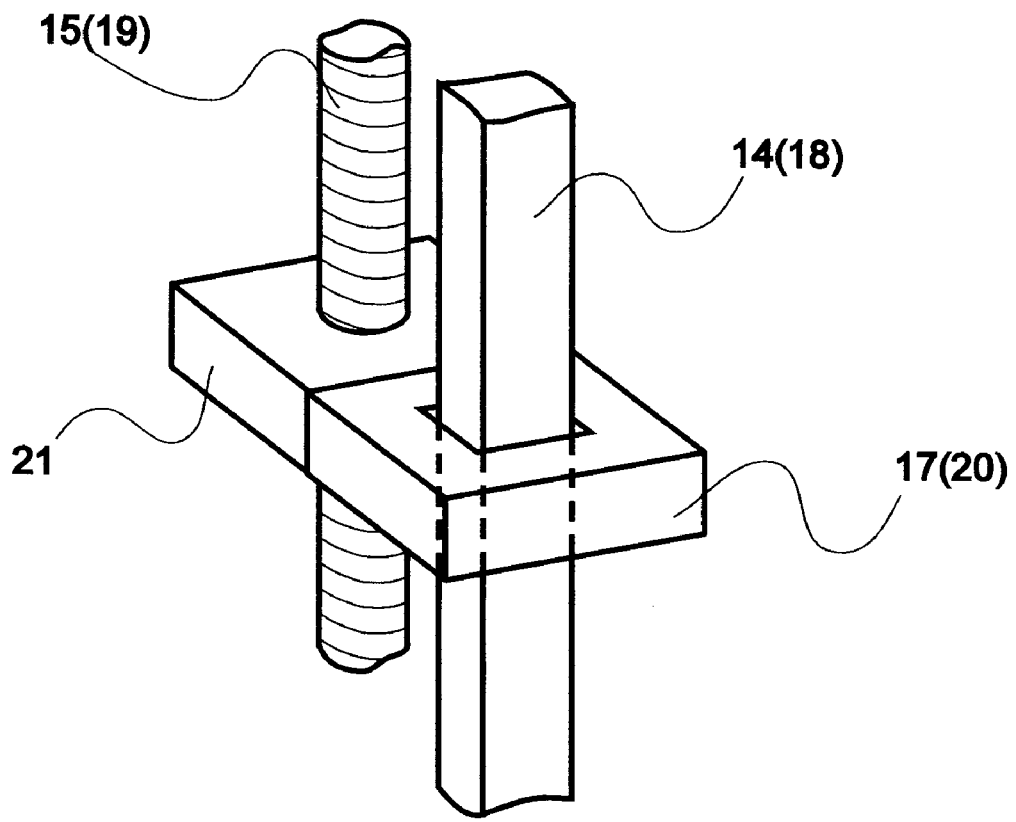
FIG. 3 is an enlarged perspective view showing an air slide illustrated in FIG. 2.

As shown in FIG. 3, the first (second) slider 17 (20) is attached integrally with each nut 21 of the ball screw 15 (19). For this reason, the first (second) slider 17 (20) is moved in the Y-axis direction with the rotating movement of the build-in motor-driven ball screw 15 provided in the table 11.

As shown in FIG. 2, a pair of struts 22 made of aluminum or ceramics is vertically attached between the table 11 and the fixed board 16, for example. The struts 22 serve to reinforce the displacement gauge scanning column 9 and have the function of preventing a deformation thereof.

As described above, the degree of straightness in the air slide guide is greatly increased and is equal to or lower than 2 µm in a stroke of 1600 mm in a vertical axis direction. Moreover, positioning accuracy is high, that is, 0.1 µm or less.

As shown in FIG. 2, the first slider 17 has a first displacement gauge 23 and a second displacement gauge 24 which are fixedly attached thereto. Similarly, the second slider 20 has a third displacement gauge 25 fixedly attached thereto. It is suitable that the first displacement gauge 23, the second displacement gauge 24 and the third displacement gauge 25 should be configured, for example, by a non-contact laser displacement gauge including a laser diode.

The displacement gauge scanning column 9 has a relatively large weight so as to be formed into the integral structure as described above. By its own weight, a movement in an X-axis direction is made smooth. Thus, an unevenness of a moving speed is greatly reduced. Consequently, positioning accuracy can be enhanced.

As shown in FIG. 1, furthermore, a control unit 26 is disposed in a bottom portion of the measuring apparatus body 1. In response to a command signal sent from the control unit 26, the X-axis driving mechanism of the displacement gauge scanning column 9 by the V-V rolling guide and the Y-axis driving mechanism of the first slider 17 and the Y-axis driving mechanism of the second slider 20 by the air slide guide are controlled to be driven in accordance with predetermined sequences, respectively. Driving portions for the X-axis driving mechanism and the two Y-axis driving mechanisms have a stepping motor, a DC servomotor or an AC servomotor.

As shown in FIG. 1, moreover, a computer 28 connected through a cable 27 is disposed adjacently to the measuring apparatus body 1 and gives a command to the control unit 26, thereby controlling the X-axis driving mechanism and the Y-axis driving mechanism. Based on various distance data obtained by a scan of the displacement gauge which will be described below, a degree of flatness of both sides of the plate P or a plate thickness is computed and a result or the like is output by means of a display 29 or a printer 30.

Next, description will be given to a main manipulation and operation of an apparatus for measuring shapes of both sides of a plate. In FIG. 1, a synthetic quartz glass plate having a height of 1650 mm (H), a width of 1850 mm (W) and a plate thickness of 15 mm, for example, is attached to the holding mechanism 5 as the plate P to be measured. The plate P has a lower edge mounted on a predetermined positioning member of the gripping mechanism 8 of the lower support member 7a. And the plate P has an upper edge abutting against a predetermined positioning member in the upper support member 7b, and is erected almost vertically. By the driving operation of the servomotor based on a command given from the control unit 26, the cross beam 6b is vertically moved downward and the plate P is fixedly held into the holding member 6 by two points of the lower support member 7a and one point of the upper support member 7b.

The gripping mechanism 8 provided on the support members 7a and 7b is moved in a vertical direction to the reference plane 4 of the longitudinal surface plate 3. Accordingly, the plate P to be measured is set into an almost vertical state in the same manner as the reference plane 4 of the longitudinal surface plate 3 and is disposed in almost parallel with the reference plane 4.

As shown in FIG. 1, the displacement gauge scanning column 9 carries out a linear movement at a certain speed in the X-axis direction (the horizontal axis direction) along a pair of V grooves 10 with the holding mechanism 5 interposed between the first air slide 12 and the second air slide 13. Moreover, the first slider 17 and the second slider 20 are caused to carry out the linear movement at a certain speed in the Y-axis direction (the vertical axis direction) along the guide rails 14 and 18, respectively. Furthermore, the first slider 17 and the second slider 20 may be moved linearly independently from each other (i.e. asynchronously) or in a synchronous linear movement.

The moving control in the X-axis and Y-axis directions is carried out by sending a command signal from the control unit 26 based on a program input from the computer 28 and controlling the X-axis driving mechanism of the displacement gauge scanning column 9, the Y-axis driving mechanism of the first slider 17 and the Y-axis driving mechanism of the second slider 20. A surface shape and a change in a plate thickness on both sides are obtained over the entire surface of the plate P through a measurement of a distance from the reference plane 4 of the longitudinal surface plate 3. As will be described below, the measurement will be done by means of the first displacement gauge 23, the second displacement gauge 24 and the third displacement gauge 25 which are attached to the first slider 17 and the second slider 20 that carry out a scanning movement in the almost vertical plane constituted in the X-axis direction and the Y-axis direction.

In the configuration of the apparatus for measuring shapes of both sides of a plate according to the embodiment, the measuring apparatus body 1 has the reference plane 4 of the longitudinal surface plate 3 disposed in an almost vertical state at one end on the strong metallic bed 2, the holding mechanism 5 for holding the plate P to be measured in almost parallel therewith and the displacement gauge scanning column 9, for example. The displacement gauge scanning column 9 includes the first air slide 17 having the first displacement gauge 23 and the second displacement gauge 24 mounted thereon, the second air slide 20 having the third displacement gauge 25 mounted thereon, and the pair of struts 22 so as to have an integral structure, and can be moved in the horizontal axis direction over the reference plane 4 along the pair of V grooves 10 over the bed 2. Moreover, the first air slide 17 and the second air slide 20 on the displacement gauge scanning column 9 are moved in the vertical axis direction over the reference plane 4.

Therefore, it is possible to obtain a very high degree of straightness and very high positioning accuracy in the linear movement in the horizontal axis direction of the displacement gauge scanning column 9. In the linear movement in the vertical axis direction of the first air slide 17 and the second air slide 20, similarly, it is possible to obtain a very high degree of straightness and very high positioning accuracy.

Accordingly, the first displacement gauge 23 and the second displacement gauge 24 which are mounted on the first air slide 17 and the third displacement gauge 25 mounted on the second air slide 20 can carry out a scanning with high precision with respect to the reference plane 4.

By means of the first displacement gauge 23 and the second displacement gauge 24, it is possible to precisely measure the shape of the surface over the entire surface of the plate P to be measured by setting the reference plane 4 of the longitudinal surface plate 3 to be a reference surface. At the same time, it is possible to precisely measure the shape of the other surface of the plate P to be measured by setting the reference plane 4 to be a reference surface by means of the third displacement gauge 25. Precision in the measurement of these surface shapes is equal to or smaller than 1 µm.

From the foregoing, in the case in which the shapes of both sides of the plate P such as a photomask for a large-sized liquid crystal are measured, it is possible to carry out a measurement with very high precision.

With reference to FIG. 4 to 7, description will be given to the method of measuring shapes of both sides of a plate according to the present invention. The same or similar portions as those described with reference to FIGS. 1 and 2 have common reference numerals.

Figure 4:
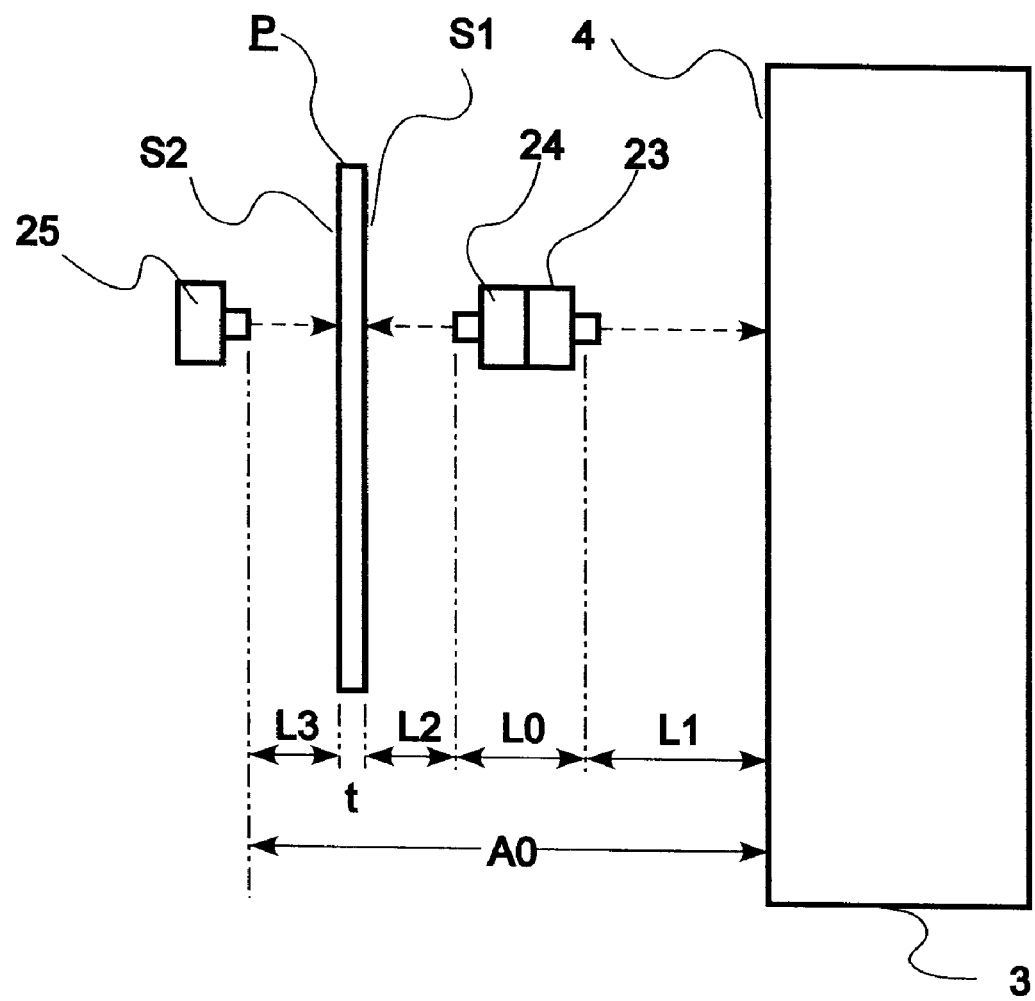
FIG. 4 is a view showing a configuration of a main part for measuring the shapes of both sides of a plate to be measured.

FIG. 4 shows a main part of the embodiment in which the surface shapes of both sides of the plate P to be measured which has the plate surface set in an almost vertical state are measured by means of the pair of first displacement gauge 23 and second displacement gauge 24 attached integrally with the first slider 17 and the third displacement gauge 25 attached to the second slider 20, for example. The first displacement gauge 23 is a non-contact laser displacement gauge, and is opposed to the longitudinal surface plate 3 in the first slider 17 and serves to measure a distance $L_1$ from the reference plane 4 of the longitudinal surface plate 3. Moreover, the second displacement gauge 24 is also the non-contact laser displacement gauge, and is opposed to a first plate surface S1 (for example, a surface) of the plate P to be measured in the first slider 17 and serves to measure a distance $L_2$ from the first plate surface S1 of the plate P to be measured. The third displacement gauge 25 is the non-contact laser displacement gauge, and is opposed to a second plate surface S2 (for example, a back surface) of the plate P to be measured in the second slider 20 and serves to measure a distance $L_3$ from the second plate surface S2 of the plate P.

The first displacement gauge 23 and the second displacement gauge 24 are scanned in almost a vertical plane constituted in the horizontal axis direction and the vertical axis direction in the reference plane 4 and measure the distances $L_1$ and $L_2$ in each portion of the first plate surface S1 of the plate P. At the same time, the third displacement gauge 25 is scanned synchronously with the first displacement gauge 23 and the second displacement gauge 24 and measures the distance $L_3$ in each portion of the second plate surface S2 of the plate P. It is assumed that an optical axis of a laser beam emitted from the second displacement gauge 24 and that of a laser beam emitted from the third displacement gauge 25 are disposed to be identical to each other. Data on the distance in each portion of the plate P are stored in the computer 28.

Figure 5:
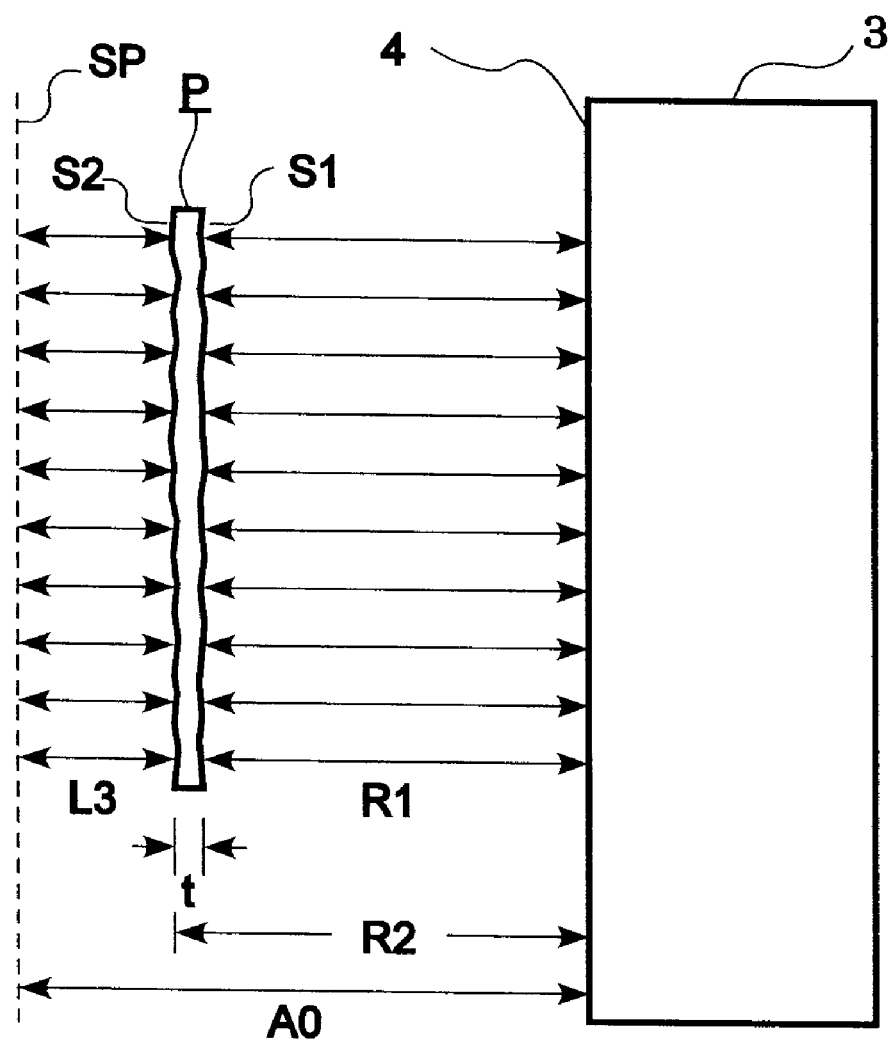
FIG. 5 is a schematic view showing a measurement of the shape of both sides of the plate to be measured and a measurement of a plate thickness.

In FIG. 4, the first and second displacement gauges 23 and 24 are mounted integrally with the first slider 17 together. Accordingly, a distance $L_0$ between the displacement gauges is constant. In the state shown in FIG. 4, therefore, a distance between the reference plane 4 of the longitudinal surface plate 3 and each portion of the first plate surface S1 of the plate P to be measured is represented as $R_1$. The distance $R_1$ can be obtained by a calculation of $R_1=L_0+L_1+L_2$. As shown in FIG. 5, thus, the distance $R_1$ is measured/calculated by setting the reference plane 4 of the longitudinal surface plate 3 to be the reference surface, and the distance $R_1$ data are stored in the computer 28. By a method, which will be described below, a degree of flatness of the first plate surface S1 of the plate P to be measured is evaluated.

Figure 6:
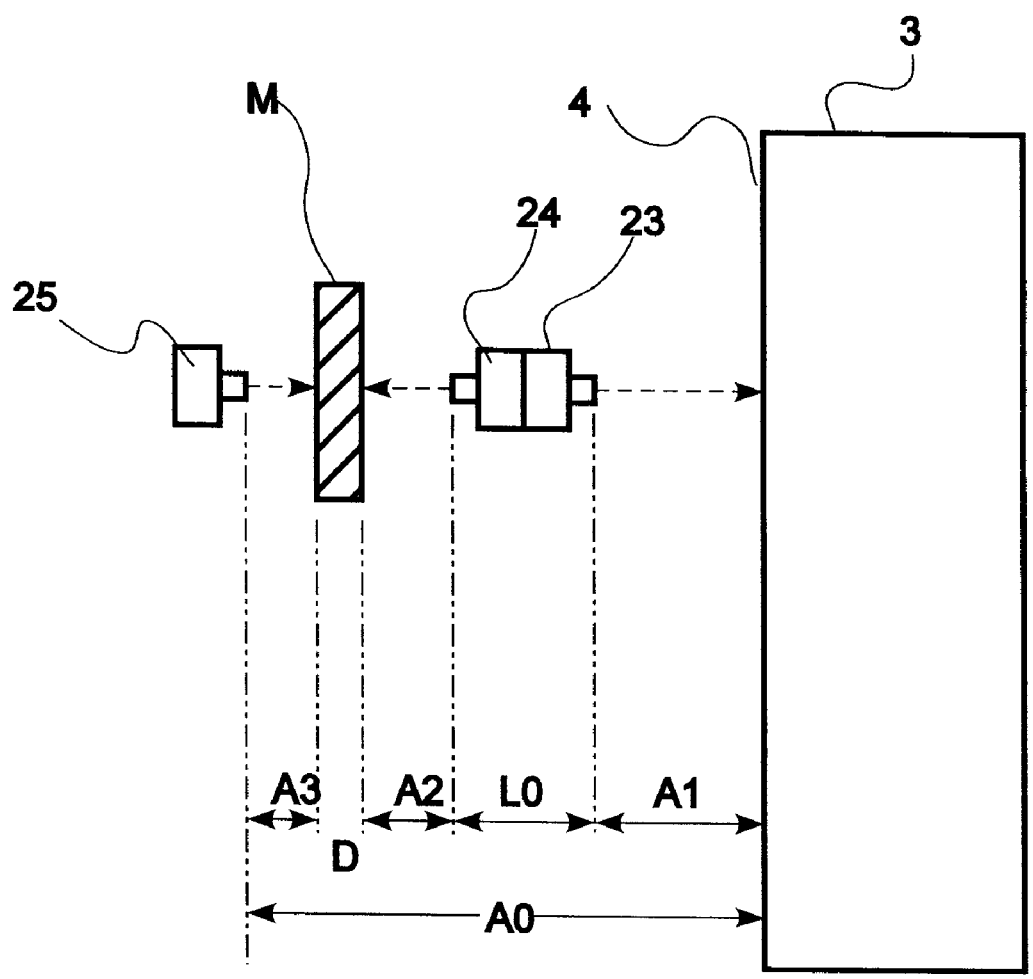
FIG. 6 is a schematic view showing a measurement of the shape of both sides of the plate to be measured and a measurement of a scan surface of a displacement gauge.

In FIG. 4, a distance $A_0$ from the reference plane 4 of the longitudinal surface plate 3 to the third displacement gauge 25 is determined by a mechanical structure of the apparatus for measuring both sides of a plate. Therefore, if the distance $A_0$ is once measured over the entire surface for the first time, it is possible to exactly use a value of the distance $A_0$ in the subsequent measurement of both sides of the plate. In order to measure the distance $A_0$, a reference block M having a thickness D is fixedly attached between the second displacement gauge 24 and the third displacement gauge 25 as shown in FIG. 6. A distance $A_1$ between the reference plane 4 and the first displacement gauge 23, a distance $A_2$ between a first surface of the reference block M and the second displacement gauge 24, and a distance $A_3$ between a second surface opposed to the first surface of the reference block M and the third displacement gauge 25 are measured. Thus, the distance $A_0$ from the reference plane 4 of the longitudinal surface plate 3 to the third displacement gauge 25 is obtained by a calculation of $A_0=A_1+A_2+A_3+L_0+D$. Referring to the distance $A_0$, the first displacement gauge 23 and the second displacement gauge 24 and third displacement gauge 25 are scanned in the horizontal axis direction and the vertical axis direction of the reference plane 4. Accordingly, the scanned surface of the third displacement gauge 3 with the reference plane 4 to be a reference surface is formed and a virtual reference plane SP shown in FIG. 5 is thus constituted.

From the distance $A_0$ data and the distance $L_3$ data, as shown in FIG. 5, the distance $R_2$ is measured/calculated with the reference plane 4 of the longitudinal surface plate 3 to be the reference surface by setting $R_2=A_0-L_3$, and the distance $R_2$ data are stored in the computer 28. By a method, which will be described below, the degree of flatness of the second plate surface S2 of the plate P to be measured is evaluated.

In FIG. 5, furthermore, a thickness t of the plate P to be measured can be obtained by a calculation of $t=A_0-L_3-R_1=R_2-R_1$. The distribution of the thickness t in the plate P is calculated and the data on the thickness t are stored in the computer 28.

Figure 7:
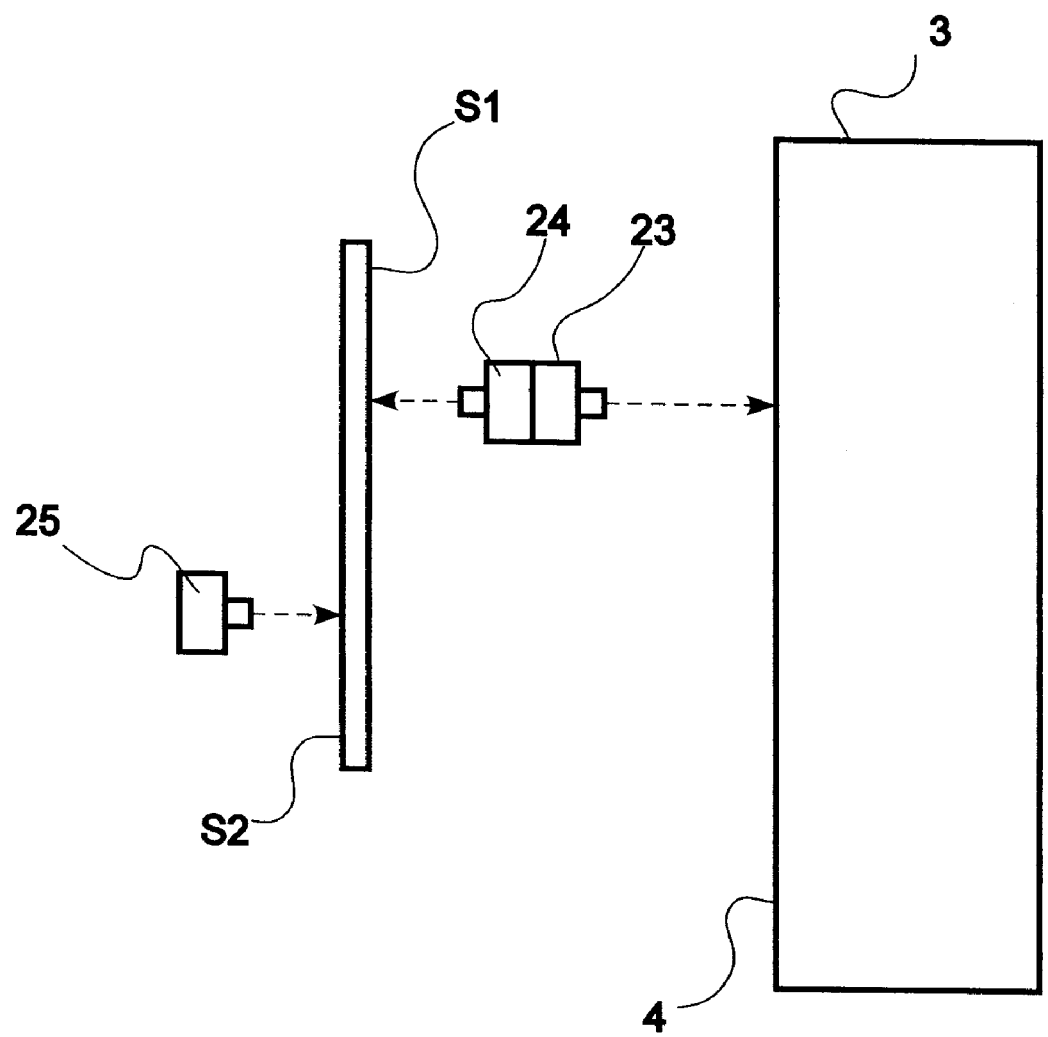
FIG. 7 is a view showing another configuration of a main part for measuring the shapes of both sides of the plate to be measured.
Figure 8B:
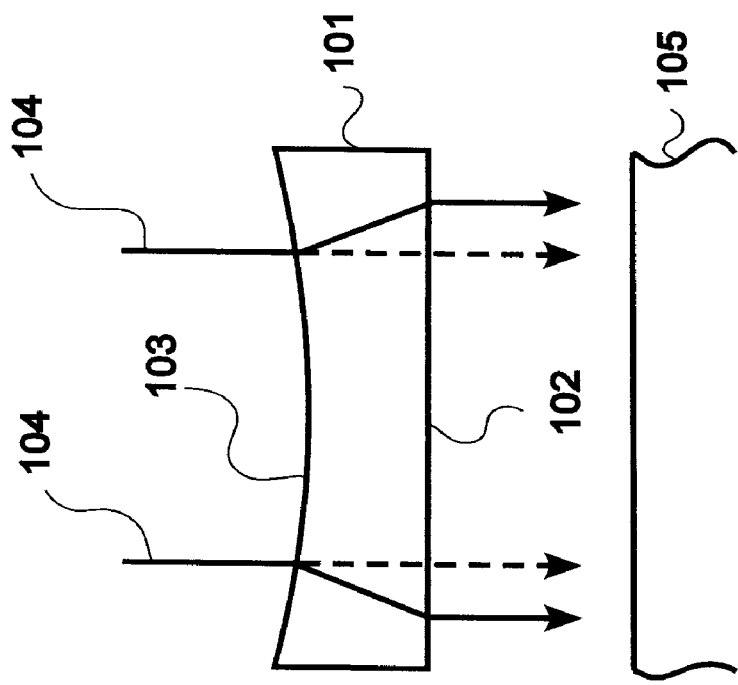
FIG. 8 is a schematic view for explaining an optical path in the case in which a light is exposed to a photomask.
Figure 8A:
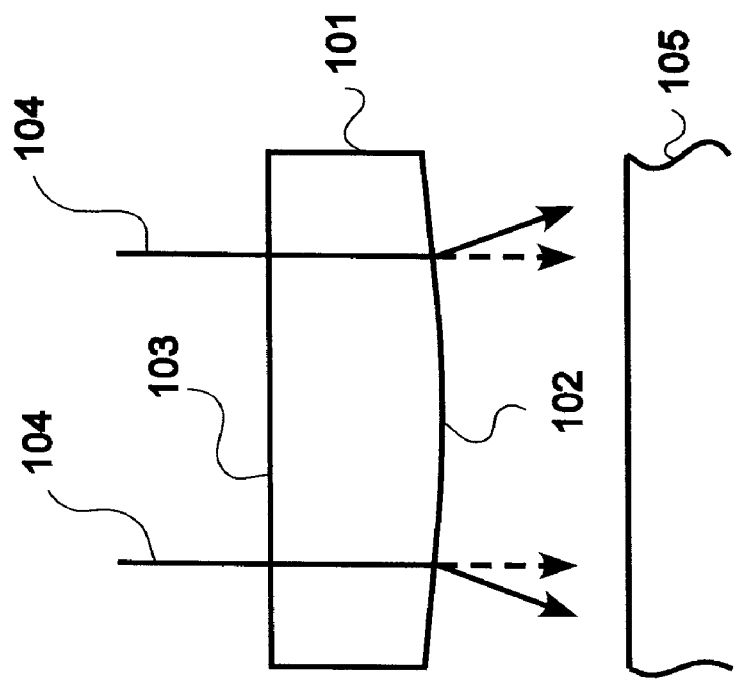

The method of measuring the shapes of both sides of the plate described with reference to FIG. 4 serves to synchronize the scan of the first displacement gauge 23 and second displacement gauge 24 and the third displacement gauge 25. In the measurement of the shapes of both sides, as shown in FIG. 7, the scan of the third displacement gauge 25 may be carried out a synchronously with the scan of the first displacement gauge 23 and the second displacement gauge 24. In this case, the distribution of the distance $R_1$ between the first plate surface S1 of the plate P to be measured and the reference plane 4 of the longitudinal surface plate 3 is obtained by the scan of the first displacement gauge 23 and the second displacement gauge 24 and the measurement of the distance as shown in FIG. 5.

In the same manner, the distribution of the distance $R_2$ between the second plate surface S2 of the plate P and the reference plane 4 of the longitudinal surface plate 3 is obtained by the scan of the third displacement gauge 25 and the measurement of the distance as shown in FIG. 5.

In case of FIG. 7, the laser beam emitted from the second displacement gauge 24 or that emitted from the third displacement gauge 25 is transmitted through the plate P. Thus, it is possible to easily prevent a reduction in precision in the measurement of the distance due to a light interference.

Next, a method of evaluating the degree of flatness of the plate P will be described with reference to FIG. 5. In a first simple method, maximum and minimum values are extracted from distribution data in the plate P to be measured which has the plate thickness t shown in FIG. 5 and a difference there between is set to be the degree of flatness. By setting a predetermined difference to be a reference degree of flatness, the degree of flatness of the plate P is evaluated. The degree of flatness is output from the display 29 and the printer 30 immediately after the measurement of the plate P, for example. In the first method, there is obtained the degree of flatness which is hardly influenced by the vertical state of the plate P or an arrangement relationship with the reference plane 4 of the longitudinal surface plate.

A second method is as follows. Although the plate P is held in an almost vertical state by means of the holding mechanism 5, the plate surface is not always set in a parallel state with the reference plane 4 of the longitudinal surface plate 3 in many cases. The second method considers such a situation.

The computer 28 executes a computation processing of obtaining the degree of flatness of the plate P by the distances $R_1$ and $R_2$ computed based on the distances $L_1$, $L_2$ and $L_3$ in each portion which are measured in such a state. In this case, there are some techniques for the processing of computing the degree of flatness of the plate P to be measured. A simple technique is as follows.

More specifically, a difference between maximum and minimum values at this time is set to be the degree of flatness of the first plate surface S1 (or the second plate surface S2) by setting, as a reference, measured values on two diagonal points of the plate P to be measured in the distance $R_1$ (or the distance $R_2$) in each portion.

More specifically, (a) the distance data $R_1$ in each portion are corrected in such a manner that the distance R1 on first two diagonal points is equal with respect to the reference plane, (2) the distance data $R_1$ corrected in the (1) are corrected again in such a manner that the distance $R_1$ on second two diagonal points is equal with respect to the reference plane, and (3) a difference between maximum and minimum values of the distance data $R_1$ corrected as described above is set to be the degree of flatness of the first plate surface S1.

Similarly, the distance data $R_2$ are corrected by carrying out entirely the same computation processing as that of the distance data $R_1$. A difference between maximum and minimum values thus corrected is set to be the degree of flatness of the second plane S2.

For the first plate surface S1 and the second plate surface S2, the degree of flatness of the plate P to be measured is evaluated by setting predetermined differences to be a reference degree of flatness, respectively. Moreover, the degree of flatness thus obtained by the computation processing is output from the display 29 and/or the printer 30 immediately after the measurement of the plate P to be measured, for example.

By the method of measuring the shapes of both sides of a plate, it is possible to easily measure the shapes of both sides of a large-sized plate to be measured such as a photomask for a large-sized liquid crystal in a short time with high precision. The degree of flatness of the plate to be measured can be obtained with high precision.

The present invention is not restricted to the embodiment but various changes can be made without departing from the scope of the present invention. For example, the displacement gauge scanning column 9 having such a structure as to be moved in the horizontal axis direction in the reference plane 4 of the longitudinal surface plate 3 over the bed 2 may have such a configuration as to be moved through a V-V slip guide.

Moreover, the first air slide 12 and the second air slide 13 which are provided on the table 11 may have such a configuration as to be moved in the vertical axis direction by means of a linear motor.

The present invention can also be applied to a plate to be measured in which the shapes of both sides of the plate are important elements in addition to the photomask made of a quartz glass for a liquid crystal as the plate P to be processed. For example, the present invention can also be effectively applied to the measurement of the shapes of both sides of a semiconductor wafer as the plate to be processed.

For the displacement gauge, moreover, an air scale sensor method, an eddy current method, an electrostatic capacity method and the like have been known. These can be properly selected corresponding to a substance constituting the plate to be measured.

What is claimed is:

1. An apparatus for measuring shapes of both sides of a glass plate, comprising:
    a surface plate disposed in such a manner that a reference plane of the surface plate is set in an almost vertical state;
    a holding mechanism which holds a plate to be measured in such a manner that a plate surface of the plate to be measured is set in almost parallel with the reference plane;
    a first displacement gauge and a second displacement gauge which are disposed between the reference plane of the surface plate and one surface of the plate to be measured which is held by the holding mechanism, the first and second displacement gauges being scanned in a vertical plane, and serving to measure a distance from the reference plane of the surface plate and a distance from one surface of the plate to be measured together with the scan, respectively;
    a third displacement gauge which is disposed on the opposite surface side of the plate, the third displacement gauge being scanned in a vertical plane and serving to measure a distance from the opposite surface of the plate surface together with the scan;
    calculating means for calculating a shape of a surface of the plate to be measured based on a measurement result by each of the displacement gauges; and
    a control unit configured to cause the third displacement gauge to operate in a synchronous scanning or an asynchronous scanning of the opposite surface of the plate with respect to the scanning of the first displacement gauge and the second displacement gauge.

2. The apparatus for measuring shapes of both sides of a glass plate according to claim 1, wherein the first displacement gauge and the second displacement gauge are mounted on a first Y-axis moving mechanism which can be moved in a vertical axis direction in the reference plane,
    the third displacement gauge is mounted on a second Y-axis moving mechanism which can be moved in the vertical axis direction in the reference plane independently of the first Y-axis moving mechanism, and
    the first Y-axis moving mechanism and the second Y-axis moving mechanism are mounted on an X-axis moving mechanism which can be moved in a horizontal axis direction in the reference plane.

3. The apparatus for measuring shapes of both sides of a glass plate according to claim 2, wherein the first Y-axis moving mechanism and the second Y-axis moving mechanism comprise a ball screw and a slide coupled thereto.

4. The apparatus for measuring shapes of both sides of a glass plate according to claim 2, wherein the X-axis moving mechanism comprises a V-V rolling guide or a V-V slip guide.

5. The apparatus for measuring shapes of both sides of a glass plate according to claim 3, wherein the X-axis moving mechanism comprises a V-V rolling guide or a V-V slip guide.

6. The apparatus for measuring shapes of both sides of a glass plate according to claim 1, wherein the first displacement gauge, the second displacement gauge and the third displacement gauge are non-contact laser displacement gauges.

7. The apparatus for measuring shapes of both sides of a glass plate according to claim 2, wherein the first displacement gauge, the second displacement gauge and the third displacement gauge are non-contact laser displacement gauges.

8. The apparatus for measuring shapes of both sides of a glass plate according to claim 3, wherein the first displacement gauge, the second displacement gauge and the third displacement gauge are non-contact laser displacement gauges.

9. The apparatus for measuring shapes of both sides of a glass plate according to claim 4, wherein the first displacement gauge, the second displacement gauge and the third displacement gauge are non-contact laser displacement gauges.

10. The apparatus for measuring shapes of both sides of a glass plate according to claim 5, wherein the first displacement gauge, the second displacement gauge and the third displacement gauge are non-contact laser displacement gauges.

11. A method of measuring shapes of both sides of a glass plate: disposing a reference plane of a surface plate in an almost vertical state;
    supporting a plate to be measured in such a manner that a plate surface of the plate to be measured is set in almost parallel with the reference plane;
    disposing a first displacement gauge opposite to the reference plane and a second displacement gauge to one surface side of the plate surface of the plate to be measured such that both gauges are scanned in a vertical plane between the reference plane and one surface side of the plate surface of the plate to be measured, a distance between the surface of the plate surface and the reference plane is measured, and at the same time, a third displacement gauge is disposed on the opposite surface side of the plate and facing the opposite surface of the plate surface is scanned, and a distance between the opposite surface of the plate surface and the reference plane is measured and surface shapes of one of the surfaces of the plate to be measured and the opposite surface are measured; and
    providing instructions as to whether the third displacement gauge should operate in a synchronous scanning or an asynchronous scanning of the opposite surface of the plate with respect to the scanning of the first displacement gauge and the second displacement gauge.

12. The method of measuring shapes of both sides of a glass plate according to claim 11, wherein a reference block having a predetermined block thickness is previously disposed between the second displacement gauge and the third displacement gauge, a distance $(A_1+A_2+L_0)$ between one surface of the reference block and the reference plane of the surface plate is measured by the first displacement gauge and the second displacement gauge, a distance ($A_3$) from the opposite surface of the reference block is measured by the third displacement gauge and a distance ($A_0$) between the third displacement gauge and the reference plane of the surface plate is measured.

13. The method of measuring shapes of both sides of a glass plate according to claim 11, wherein a plate thickness to be measured is measured by measuring the distance between the one surface of the plate to be measured and the reference plane by means of the first displacement gauge and the second displacement gauge and measuring the distance between the opposite surface of the plate surface and the reference plane by means of the third displacement gauge.

14. The method of measuring shapes of both sides of a glass plate according to claim 12, wherein a plate thickness to be measured is measured by measuring the distance between the one surface of the plate to be measured and the reference plane by means of the first displacement gauge and the second displacement gauge and measuring the distance between the opposite surface of the plate surface and the reference plane by means of the third displacement gauge.

15. An apparatus, comprising:
a first plate having a surface with an associated reference plane;
a holding mechanism configured to position a second plate substantially parallel to the reference plane of the surface of the first plate, the second plate being made of glass;
a scanning mechanism configured to scan and measure a first surface and a second surface of the second plate concurrently, the second surface of the second plate being opposite from the first surface;
a control unit configured to cause a synchronous scanning or an asynchronous scanning of the second surface of the second plate with respect to the scanning of the first surface of the second plate; and
calculating means configured to determine a flatness associated with the second plate based on measurements from the scanning mechanism.

16. The apparatus of claim 15, wherein:
the scanning mechanism includes a first measurement device, a second measurement device, and a third measurement device, the first measurement device configured to measure a distance from the first measurement device to the surface of the first plate, the second measurement device configured to measure a distance from the second measurement device to the first surface of the second plate, the third measurement device configured to measure a distance from the third measurement device to the second surface of the second plate, and
the calculating means is configured to determine the flatness associated with the second plate based on measurements from the first measurement device, the second measurement device, and the third measurement device.

17. The apparatus of claim 15, wherein:
the scanning mechanism includes a first measurement device, a second measurement device, and a third measurement device, the first measurement device configured to measure a distance from the first measurement device to the surface of the first plate, the second measurement device configured to measure a distance from the second measurement device to the first surface of the second plate, the third measurement device configured to measure a distance from the third measurement device to the second surface of the second plate, the first measurement device and the second measurement device collectively configured to operate in a synchronous scanning or an asynchronous scanning with the third measurement device.

18. The apparatus of claim 15, wherein:
the calculating means is configured to determine a thickness associated with the second plate based on measurements from the scanning mechanism.

* * * * *